(12) United States Patent
Takada et al.

(10) Patent No.: US 9,627,423 B2
(45) Date of Patent: Apr. 18, 2017

(54) SOLID-STATE IMAGE PICKUP APPARATUS AND IMAGE PICKUP SYSTEM HAVING A CLIPPING CIRCUIT ARRANGED CLOSE TO AN N-ROW SIGNAL MIXING REGION

(71) Applicant: CANON KABUSHIKI KAISHA, Tokyo (JP)

(72) Inventors: Yoshiaki Takada, Kawasaki (JP); Masaaki Iwane, Sagamihara (JP); Kazuki Ohshitanai, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 44 days.

(21) Appl. No.: 14/834,860

(22) Filed: Aug. 25, 2015

(65) Prior Publication Data
US 2016/0064442 A1    Mar. 3, 2016

(30) Foreign Application Priority Data
Aug. 29, 2014  (JP) .................................. 2014-174954

(51) Int. Cl.
| H01L 27/146 | (2006.01) |
| H04N 5/357 | (2011.01) |
| H04N 5/365 | (2011.01) |
| H04N 5/3745 | (2011.01) |

(52) U.S. Cl.
CPC .. *H01L 27/14609* (2013.01); *H01L 27/14603* (2013.01); *H04N 5/3575* (2013.01); *H04N 5/3658* (2013.01); *H04N 5/37457* (2013.01)

(58) Field of Classification Search
CPC ......... H01L 27/14612; H01L 27/14609; H01L 27/14641

USPC .......................................... 250/208.1, 214 R
See application file for complete search history.

(56) References Cited

U.S. PATENT DOCUMENTS

| 6,534,336 | B1 | 3/2003 | Iwane et al. |
| 6,963,371 | B2 | 11/2005 | Sakurai et al. |
| 7,723,661 | B2 * | 5/2010 | Hara ...................... H04N 3/155 250/208.1 |
| 7,935,995 | B2 | 5/2011 | Watanabe et al. |

(Continued)

FOREIGN PATENT DOCUMENTS

| JP | 2001-230974 | 8/2001 |
| JP | 2011-097646 | 5/2011 |

OTHER PUBLICATIONS

U.S. Appl. No. 14/683,595, Yoshiaki Takada, filed Apr. 10, 2015.
U.S. Appl. No. 14/818,560, Masaaki Iwane, filed Aug. 5, 2015.

*Primary Examiner* — Que T Le
(74) *Attorney, Agent, or Firm* — Fitzpatrick, Cella, Harper & Scinto

(57) ABSTRACT

Provided is a solid-state image pickup apparatus, including: a pixel region, in which a plurality of pixels each including an amplifier transistor are arranged two-dimensionally in rows and columns, and which includes an n-row signal mixing region in which outputs of n amplifier transistors are mixed, where n is a natural number of 1 or more, and an m-row signal mixing region in which outputs of m amplifier transistors are mixed, where m>n; a column signal line to which a voltage from the amplifier transistor is output; and a clipping circuit, which is configured to clip a voltage in the column signal line, and is arranged at a position that is closer to the n-row signal mixing region than to the m-row signal mixing region.

9 Claims, 11 Drawing Sheets

(56) References Cited

U.S. PATENT DOCUMENTS

| | | |
|---|---|---|
| 8,111,311 B2 | 2/2012 | Iwane |
| 8,139,133 B2 | 3/2012 | Iwane et al. |
| 8,325,260 B2 | 12/2012 | Yamazaki et al. |
| 8,345,137 B2 | 1/2013 | Shinohara et al. |
| 9,001,249 B2 | 4/2015 | Iwane |
| 9,053,996 B2 | 6/2015 | Iwane et al. |
| 9,117,718 B2 | 8/2015 | Ohshitanai et al. |
| 2014/0036121 A1 | 2/2014 | Minowa et al. |
| 2014/0320720 A1 | 10/2014 | Ohshitanai |
| 2014/0333815 A1 | 11/2014 | Iwane et al. |
| 2014/0340555 A1 | 11/2014 | Iwane et al. |
| 2015/0163426 A1 | 6/2015 | Ohshitanai |
| 2015/0281610 A1 | 10/2015 | Ota et al. |

\* cited by examiner

SOLID-STATE IMAGE PICKUP APPARATUS AND IMAGE PICKUP SYSTEM HAVING A CLIPPING CIRCUIT ARRANGED CLOSE TO AN N-ROW SIGNAL MIXING REGION

BACKGROUND OF THE INVENTION

Field of the Invention

The present invention relates to a solid-state image pickup apparatus and an image pickup system.

Description of the Related Art

In FIG. 1 of Japanese Patent Application Laid-Open No. 2001-230974, it is disclosed that even when strong light enters pixels in a CMOS-type solid-state image pickup apparatus, voltages of column signal lines (V1 to V3) are limited to a voltage set by clipping MOSs (M71 to M73). Moreover, in Japanese Patent Application Laid-Open No. 2011-097646, it is disclosed that signal outputs of a plurality of amplifier transistors (Tb) in an image pickup region (11) are mixed on column signal lines (VLIN1, VLIN2, and VLIN3).

SUMMARY OF THE INVENTION

In the above-mentioned documents, a circuit configuration for reducing vertical stripe noise is not disclosed. It is an object of the present invention to provide a solid-state image pickup apparatus capable of reducing the vertical stripe noise while suppressing a blackening phenomenon.

According to one embodiment of the present invention, there is provided a solid-state image pickup apparatus, including: a pixel region, in which a plurality of pixels each including an amplifier transistor are arranged two-dimensionally in a plurality of rows and a plurality of columns, and which includes an n-row signal mixing region in which outputs of n amplifier transistors are mixed, where n is a natural number of 1 or more, and an m-row signal mixing region in which outputs of m amplifier transistors are mixed, where m>n; a column signal line to which a voltage from the amplifier transistor is output; and a clipping circuit, which is configured to clip a voltage in the column signal line, and is arranged at a position that is closer to the n-row signal mixing region than to the m-row signal mixing region.

According to the one embodiment of the present invention, it is possible to provide the solid-state image pickup apparatus capable of reducing a vertical stripe noise while suppressing a blackening phenomenon.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
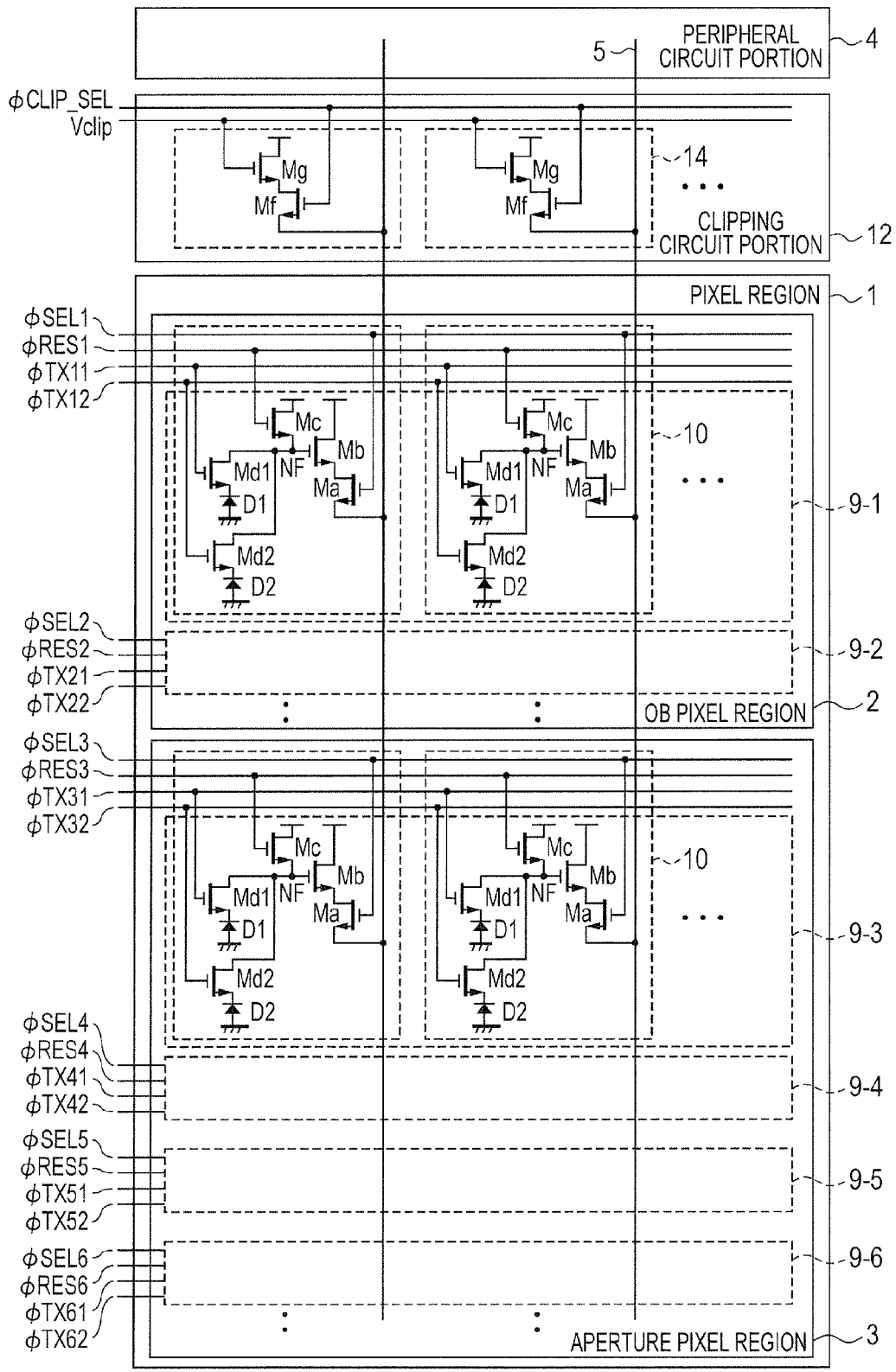
FIG. 1 is a circuit diagram of a solid-state image pickup apparatus according to a first embodiment of the present invention.

In FIG. 1, a circuit configuration of a solid-state image pickup apparatus according to a first embodiment of the present invention is illustrated. The solid-state image pickup apparatus includes a pixel region 1, a peripheral circuit 4, and a clipping circuit 12 configured to limit voltages of column signal lines 5 so that the voltages do not fall to or below a predetermined value. The pixel region 1 includes a plurality of unit pixels 10 arranged two-dimensionally in rows and columns. The pixel region 1 includes an optical black pixel region (OB pixel region) 2 including optical black pixels, which are unit pixels 10 in which photodiodes are shielded from light by aluminum (Al) or the like, and an aperture pixel region 3 including aperture pixels, which are unit pixels 10 in which photodiodes are not shielded from light. As used herein, the term "row direction" indicates the horizontal direction in the drawings, and the term "column direction" indicates the vertical direction in the drawings.

The OB pixel region 2 includes a plurality of pixel rows, of which only pixel rows 9-1 and 9-2 are illustrated in FIG. 1. The aperture pixel region 3 also includes a plurality of pixel rows, of which only pixel rows 9-3, 9-4, 9-5, and 9-6 are illustrated in FIG. 1. Each of the pixel rows includes a plurality of unit pixels sharing two pixels, and four unit pixels 10 are illustrated in FIG. 1. Each of the unit pixels 10 includes photodiodes D1 and D2, a transfer transistor Md1 in the first row, a transfer transistor Md2 in the second row, a reset transistor Mc, an amplifier transistor Mb, a selection transistor Ma, and an input node NF of the amplifier transistor Mb. In this embodiment, the transistors of the unit pixel 10 include n-type MOS transistors.

The input node NF is connected to drains of the transfer transistors Md1 and Md2, a source of the reset transistor Mc, and a gate of the amplifier transistor Mb. The two photodiodes D1 and D2 and the two transfer transistors Md1 and Md2 share the reset transistor Mc, the amplifier transistor Mb, the selection transistor Ma, and the input node NF. The transfer transistors Md1 and Md2 are turned on to transfer electric charges of the photodiodes D1 and D2 to the input node NF, with the result that the input node NF functions as a so-called floating diffusion (hereinafter referred to as "FD"). Note that, there are a large number of unit pixels 10 in the pixel region 1, and when the number of pixel rows and the number of pixel columns in the pixel region 1 are represented by M and N, respectively, there are 2×M×N photodiodes. In the following description, the unit pixel 10 includes two photodiode rows, and hence the two photodiode rows in a pixel row are referred to as "row D1" and "row D2", respectively.

In the pixel region 1, signal lines φSEL1 to φSEL6, φRES1 to φRES6, φTX11 to φTX61, and φTX12 to φTX62 are arranged to extend in the row direction. To a gate of the transfer transistor Md1, φTX11 is connected, and when φTX11 becomes High level, the transfer transistor Md1 transfers the electric charges obtained by photoelectric conversion in the photodiode D1 to the input node NF. Similarly, to a gate of the transfer transistor Md2, φTX12 is connected, and when φTX12 becomes High level, the transfer transistor Md2 transfers the electric charges of the photodiode D2 to the input node NF. The amplifier transistor Mb outputs a signal corresponding to a voltage at the input node NF. To a gate of the reset transistor Mc, φRES1 is connected, and when φRES1 becomes High level, the reset transistor Mc resets the electric charges of the input node NF. To a gate of the selection transistor Ma, φSEL1 is connected, and when φSEL1 becomes High level, the selection transistor Ma outputs the signal from the amplifier transistor Mb to a column signal line 5. To the column signal line 5, a reset voltage at the time when the input node NF is reset, and luminance voltages based on the electric charges of the photodiodes D1 and D2 may be output. For each column in the pixel region 1, a column signal line 5 is arranged. The column signal line 5 is connected to sources of the selection transistors Ma of the unit pixels 10 arranged in the column direction to serve as a signal line common to the unit pixels 10.

The clipping circuit 12 includes a plurality of clipping circuits 14 respectively provided to the column signal lines 5. Each of the clipping circuits 14 includes a clip transistor Mg and a clip selection transistor Mf, which are n-type MOS transistors. The clip transistor Mg has a drain connected to a power source, and a source connected to the column signal line 5 via the clip selection transistor Mf. Moreover, to a gate of the clip transistor Mg, a clip voltage Vclip corresponding to a threshold of a clip voltage is applied. The clip selection transistor Mf has a gate connected to a signal line φCLIP_SEL, and when φCLIP_SEL becomes High level, the source of the clip transistor Mg is connected to the column signal line 5 via the clip selection transistor Mf. On the other hand, in the unit pixel 10, when φSEL1 becomes High level, a source of the amplifier transistor Mb is connected to the column signal line 5 via the selection transistor Ma. The source of the clip transistor Mg and the source of the amplifier transistor Mb are commonly connected, with the result that the clip transistor Mg and the amplifier transistor Mb have a differential configuration. In a case where a gate voltage of the amplifier transistor Mb is sufficiently higher than the clip voltage Vclip, the clip transistor Mg is turned off, and a voltage corresponding to the gate voltage of the amplifier transistor Mb is output to the column signal line 5. When the gate voltage of the amplifier transistor Mb is reduced to approach the clip voltage Vclip, the clip transistor Mg is turned on, and a source voltage of the amplifier transistor Mb is clipped. Therefore, the column signal line 5 does not fall to or below a voltage set by the clip voltage Vclip.

The peripheral circuit 4 includes a circuit configured to sample and amplify luminance voltages and reset voltages output to the column signal lines 5. Moreover, although not shown, the solid-state image pickup apparatus includes a timing generator configured to generate control signals, and a vertical scanning circuit configured to select pixel rows. The vertical scanning circuit is capable of signal mixing pixel signals in a plurality of arbitrary pixel rows to read a plurality of rows simultaneously. In the pixel region 1, an n-row signal mixing region having pixel rows for outputting signals from n unit pixels 10 to the column signal line, where n is a natural number of 1 or more, and an m-row signal mixing region having pixel rows for outputting signals from m unit pixels 10 to the column signal line 5, where m>n, may be set. In this embodiment, the n-row signal mixing region is set in the OB pixel region 2, and the m-row signal mixing region is set in the aperture pixel region 3. The clipping circuit 12 configured to limit signal voltages of the column signal lines 5 is arranged at a position that is closer to the n-row signal mixing region than to the m-row signal mixing region. Note that, the n-row signal mixing region may be arranged in the aperture pixel region 3. Pixel signal mixing may be performed with a circuit arrangement as described above to set an optimal clip voltage, suppress a blackening phenomenon, and reduce vertical stripe noise as described below.

Figure 2:
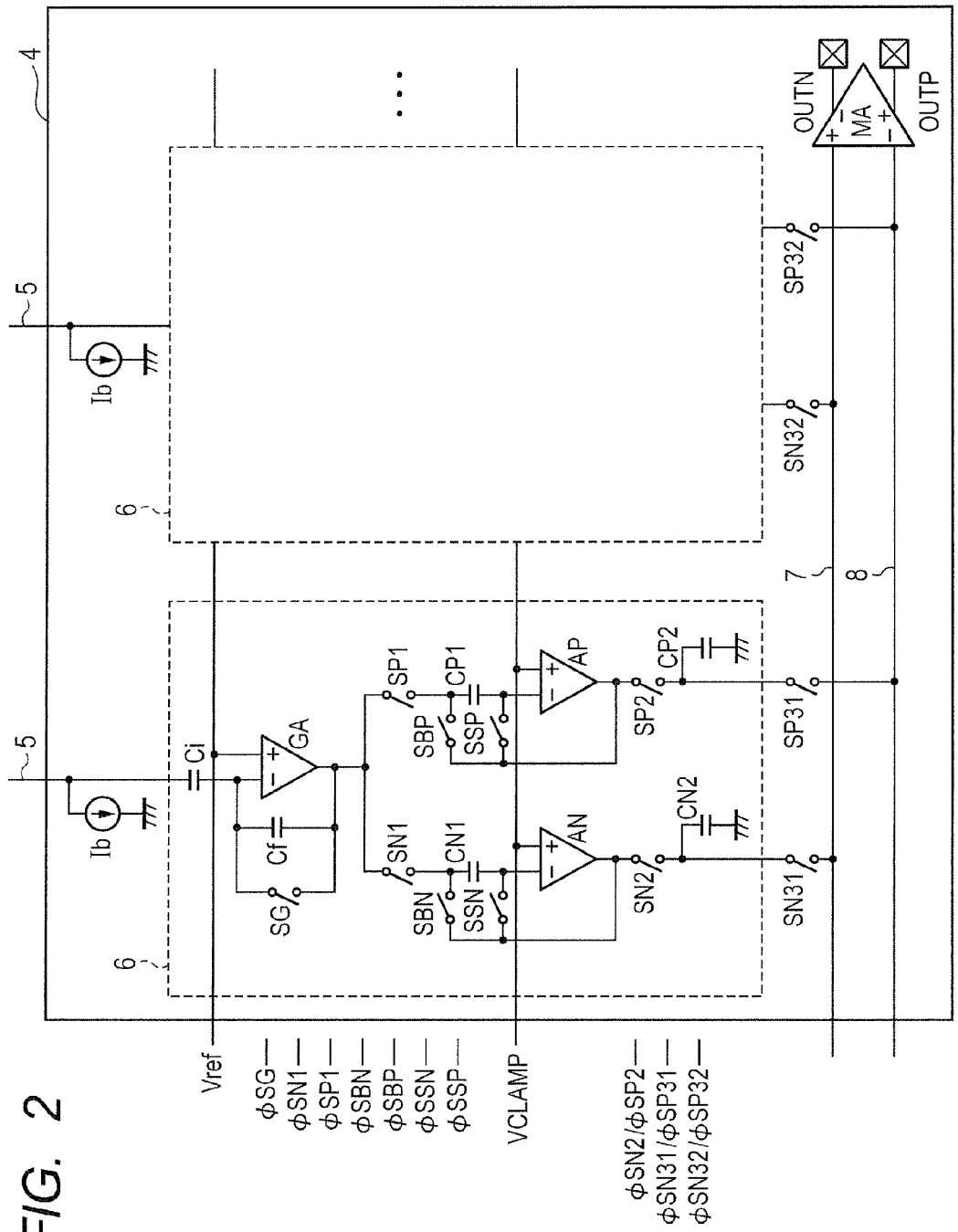
FIG. 2 is a circuit diagram of a peripheral circuit of the first embodiment.

FIG. 2 is a circuit diagram of the peripheral circuit 4. The peripheral circuit 4 includes a column readout circuit 6, a gain amplifier GA, an input capacitor Ci, a feedback capacitor Cf, a reset voltage capacitor CN1, a luminance voltage capacitor CP1, a reset voltage capacitor CN2, a luminance voltage capacitor CP2, a reset voltage amplifier AN, and a luminance voltage amplifier AP. The peripheral circuit 4 also includes a column current source Ib, an output circuit MA, and switches SG, SN1, SP1, SBN, SSN, SBP, SSP, SN2, SP2, SN31, SP31, SN32, and SP32, which are formed of MOS transistors. These switches are driven by the timing generator and a horizontal scanning circuit, which are not shown.

In a case where the selection transistor Ma is turned on, the column current source Ib serves as a load for the amplifier transistor Mb. In other words, a current from the source of the amplifier transistor Mb flows to the column current source Ib via the column signal lines 5. The gain amplifier GA is formed of a differential amplifier, and has a non-inverting input to which a reference voltage Vref is applied, and an inverting input to which the column signal line 5 is connected via the input capacitor Ci. The switch SG is connected in parallel to the feedback capacitor Cf, and when the switch SG is turned on, the gain amplifier GA operates as a voltage follower. When the switch SG is turned off, the gain amplifier GA operates with a gain expressed as (Ci/Cf).

The reset voltage capacitor CN1 is a capacitor for holding a signal at the time of resetting, and the phrase "at the time of resetting" as used herein refers to a state before the electric charges of the photodiode D1 are transferred. In other words, a signal corresponding to the input node NF at the time of resetting is written into the reset voltage capacitor CN1 via the amplifier transistor Mb and the gain amplifier GA. The luminance voltage capacitor CP1 is a capacitor for holding the luminance voltage, and a signal corresponding to the input node NF after the electric charges of the photodiode D1 are transferred is written into the luminance voltage capacitor CP1 via the amplifier transistor Mb and the gain amplifier GA.

The reset voltage amplifier AN is formed of a differential amplifier, and has a non-inverting input to which a clamp voltage VCLAMP is applied, and an inverting input to which the reset voltage capacitor CN1 is connected. An output of the reset voltage amplifier AN is connected to the reset voltage capacitor CN2 via the switch SN2. The reset voltage capacitor CN2 is further connected to a reset voltage horizontal signal line 7 via the switch SN31, and the reset voltage horizontal signal line 7 is connected to the output circuit MA. The luminance voltage amplifier AP and the luminance voltage capacitor CP2 are also configured in a similar manner, and an output of the luminance voltage amplifier AP is connected to the output circuit MA via the switch SP31 and a luminance voltage horizontal signal line 8. The output circuit MA is a differential amplifier circuit configured to generate a signal expressed as (luminance voltage-reset voltage) and output a voltage on which correlated double sampling has been performed to the outside of the chip.

Figure 3:
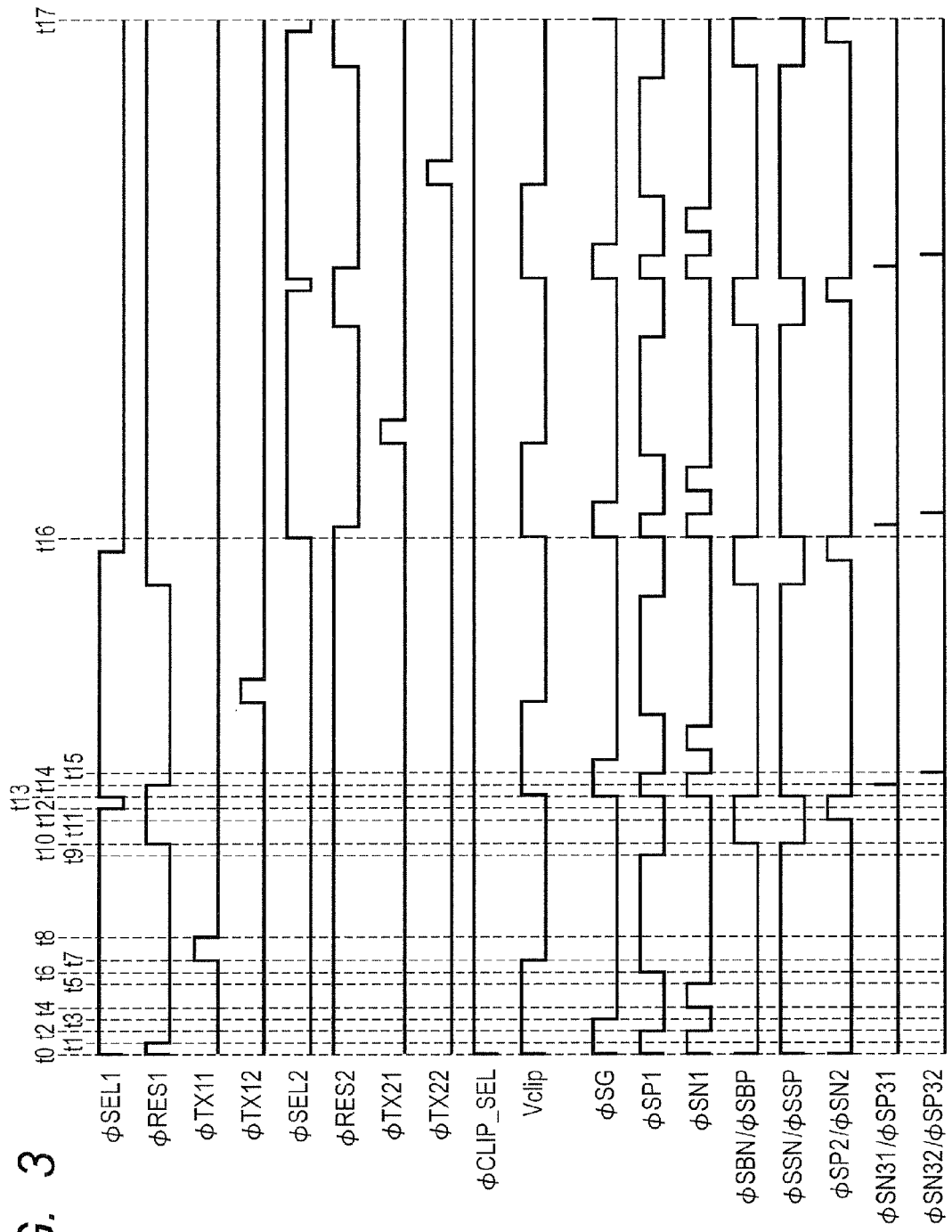
FIG. 3 is a timing chart for illustrating an operation at a time of scanning an OB pixel region of the first embodiment.

Referring to a timing chart of FIG. 3, an operation of reading signals in the OB pixel region 2 of the solid-state image pickup apparatus in the first embodiment is described. First, at time t0, φSEL1 becomes High level so that the selection transistor Ma formed of the n-type MOS is turned on, with the result that the pixel row 9-1 is selected. At the same time, φCLIP_SEL becomes High level so that the clip selection transistor Mf is turned on, with the result that the clipping circuit 14 is selected, and that a predetermined clip voltage Vclip is supplied to the gate of the clip transistor Mg. At the same time, φSG becomes High level so that the switch SG is turned on, with the result that the gain amplifier GA operates as the voltage follower for the reference voltage Vref to output the reference voltage Vref. Further, φSBN and φSBP become Low level so that the switches SBN and SBP are turned off, and φSSN and φSSP become High level so that the switches SSN and SSP are turned on. In this manner, the reset voltage amplifier AN and the luminance voltage amplifier AP enter a sampling mode, and the reset voltage capacitor CN1 and the luminance voltage capacitor CP1 becomes a state in which signals can be written. Then, φSN1 and φSP1 become High level, with the result that the reference voltage Vref is written into the reset voltage capacitor CN1 and the luminance voltage capacitor CP1 via the gain amplifier GA.

At time t1, φRES1 becomes Low level so that the reset transistor Mc in the pixel row 9-1 is turned off, with the result that the input node NF becomes a floating state. At time t2, φSN1 and φSP1 become Low level so that the switches SN1 and SP1 are turned off, which ends the writing of the reference voltage Vref into the reset voltage capacitor CN1 and the luminance voltage capacitor CP1.

At time t3, φSG becomes Low level so that the switch SG is turned off, with the result that the gain of the gain amplifier GA becomes (Ci/Cf). At time t4, φSN1 becomes High level so that the switch SN1 is turned on, with the result that voltages at the time when the input nodes NF of unit pixels 10 included in the pixel row 9-1 are reset start to be written into the reset voltage capacitors CN1 via the amplifier transistors Mb with the column current sources Ib being a load. In other words, the signals in the state before the electric charges of the photodiodes D1 and D2 are transferred are supplied to the reset voltage capacitors. At time t5, φSN1 is turned off, which ends the writing of the reset voltages of the input nodes NF into the reset voltage capacitors CN1.

At time t6, φSP1 becomes High level so that the switch SP1 is turned on, with the result that the voltages of the input nodes NF of the unit pixels 10 included in the pixel row 9-1 start to be written into the luminance voltage capacitors CP1 via the amplifier transistors Mb. At time t7, the clip voltage Vclip becomes 0 V, which ends an effective period of clipping. Moreover, φTX11 becomes High level so that the transfer transistor Md1 in the row D1 of the pixel row 9-1 is turned on, with the result that charges accumulated by irradiating light on the photodiode D1 are transferred to the input node NF. Then, the voltage of the input node NF is reduced depending on an amount of accumulated charges of the photodiode D1, and the voltage is written into the luminance voltage capacitor CP1.

At time t8, φTX11 becomes Low level so that the transfer transistor Md1 in the row D1 of the pixel row 9-1 is turned off, which ends the transfer of the charges accumulated in the photodiode D1 to the input node NF. At time t9, φSP1 becomes Low level so that the switch SP1 is turned off, which ends the writing of the luminance voltage into the luminance voltage capacitor CP1.

At time t10, φRES1 becomes High level so that the n-type MOS reset transistor Mc in the pixel row 9-1 is turned on, which ends the floating state of the input node NF. At the same time, φSBN and φSBP become High level so that the switches SBN and SBP are turned on, and φSSN and φSSP become Low level so that the switches SSN and SSP are turned off. Accordingly, the reset voltage amplifier AN enters a mode of reading the signal of the reset voltage capacitor CN1, and the luminance voltage amplifier AP enters a mode of reading the signal of the luminance voltage capacitor CP1. At time t11, φSN2 becomes High level so that the switch SN2 is turned on, with the result that the reset voltage, which has been written into the reset voltage capacitor CN1, starts to be written into the reset voltage capacitor CN2 by the reset voltage amplifier AN. Moreover, φSP2 becomes High level so that the switch SP2 is turned on, with the result that the luminance voltage starts to be written into the luminance voltage capacitor CP2 by the luminance voltage amplifier AP.

At time t12, φSEL1 becomes Low level so that the selection transistor Ma in the pixel row 9-1 is turned off, which ends the reading of the pixel signals in the row D1 of the pixel row 9-1 to the peripheral circuit 4. At time t13, φSN2 and φSP2 become Low level, which ends the writing of the reset voltage into the reset voltage capacitor CN2 and the writing of the luminance voltage into the luminance voltage capacitor CP2. At the same time, φSBN and φSBP become Low level so that the switches SBN and SBP are turned off, and φSSN and φSSP become High level so that the switches SSN and SSP are turned on, with the result that the reset voltage amplifier AN and the luminance voltage amplifier AP return to the sampling mode.

At time t14, φSN31 and φSP31 become High level so that the switches SN31 and SP31 are turned on. Then, the reset voltage and the luminance voltage in the first column stored in the reset voltage capacitor CN2 and the luminance voltage capacitor CP2 are read to the reset voltage horizontal signal line 7 and the luminance voltage horizontal signal line 8, respectively. At this time, in a case where a capacitance value of the luminance voltage capacitor CP2 is represented by C1, and a capacitance value of the reset voltage horizontal signal line 7 and the luminance voltage horizontal signal line 8 is represented by C2, the reset voltage and the luminance voltage are read with a gain expressed as C1/(C1+C2). At this time, the voltages at the reset voltage capacitor CN2 and the luminance voltage capacitor CP2 also change with the gain expressed as C1/(C1+C2). The output circuit MA generates the signal expressed as (luminance voltage-reset voltage) from the reset voltage horizontal signal line 7 and the luminance voltage horizontal signal line 8, and outputs the voltage on which the correlated double sampling has been performed to the outside of the chip.

At time t15, φSN32 and φSP32 become High level so that the switches SN32 and SP32 are turned on. In this manner, the reset voltage and the luminance voltage in the second column stored in the reset voltage capacitor CN2 and the luminance voltage capacitor CP2 are read to the reset voltage horizontal signal line 7 and the luminance voltage horizontal signal line 8, respectively. The switches SN32 and SP32 and the following switches are sequentially turned on at and after time t15. At a time when the switching on is finished for all the columns and a voltage on which the correlated double sampling has been performed of the last column is output by the output circuit MA, the output of pixel signals in the row D1 of the pixel row 9-1 to the outside of the chip is finished.

At and after time t13, the reset voltage and the luminance voltage in the row D2 of the pixel row 9-1 are read. The reading operation for the row D2 is similar to the reading operation for the row D1 of the pixel row 9-1 (times t0 to t13), and hence a description thereof is omitted. Further, at times t16 to t17, pixel signals in the pixel row 9-2 are read. The reading operation for the pixel row 9-2 is similar to the reading operation for the pixel row 9-1 (times t0 to t16). It should be noted, however, that φSEL1, φRES1, φTX11, and φTX12 in the above description are replaced by φSEL2, φRES2, φTX21, and φTX22, respectively.

Figure 4:
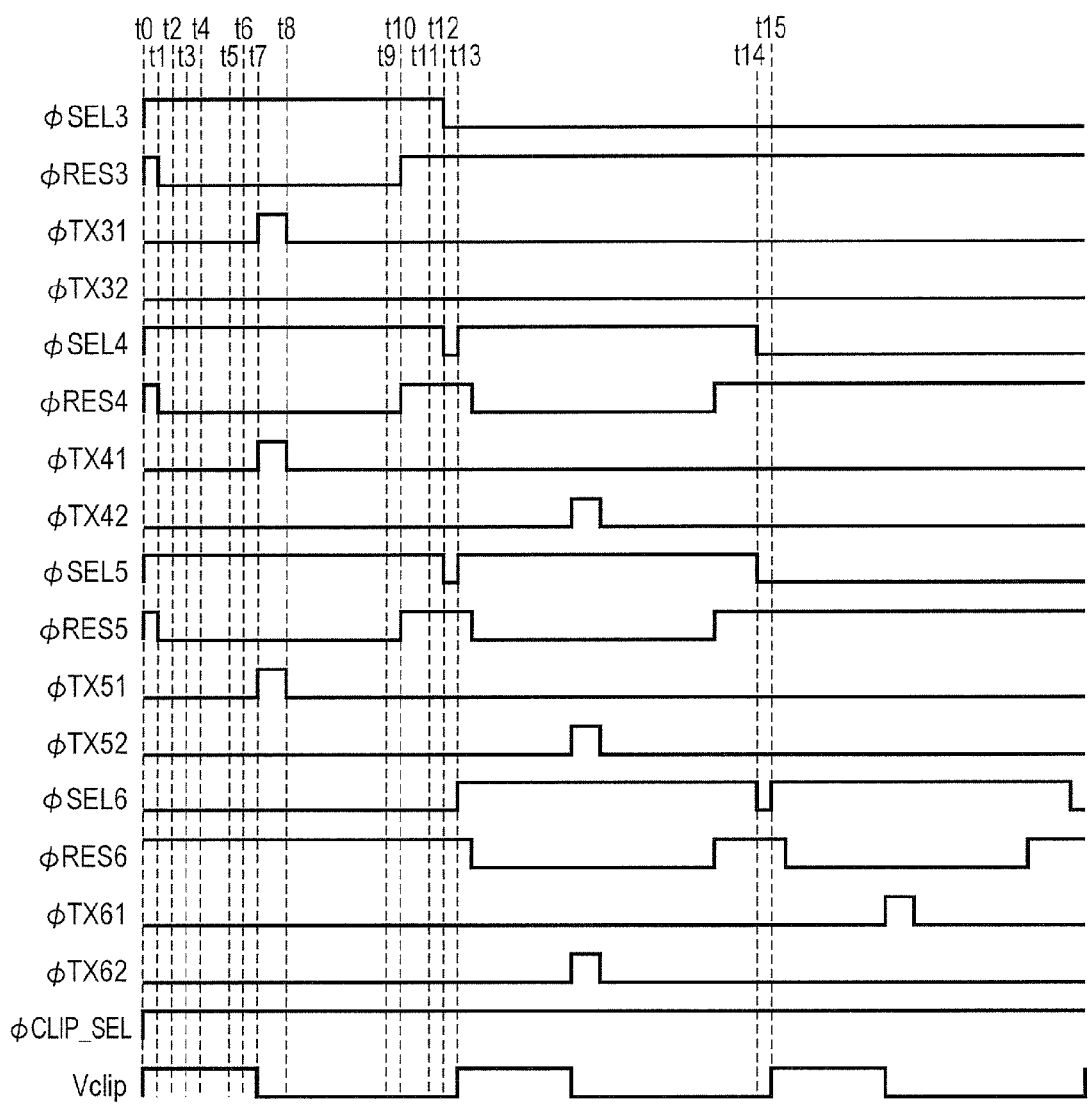
FIG. 4 is a timing chart for illustrating an operation at a time of scanning an aperture pixel region of the first embodiment.

Next, referring to a timing chart of FIG. 4, a reading operation of signals in the aperture pixel region 3 in the first embodiment is described. The operation of the peripheral circuit 4 is the same as in the reading operation of the signals in the OB pixel region 2, and hence the control signals for the peripheral circuit 4 are omitted in the timing chart of FIG. 4.

First, at time t0, φSEL3, φSEL4, and φSEL5 become High level so that the selection transistors Ma are turned on, with the result that the pixel rows 9-3, 9-4, and 9-5 in the aperture pixel region 3 are simultaneously selected. When φCLIP_SEL becomes High level so that the clip selection transistor Mf is turned on, the clipping circuit 14 is selected. The predetermined clip voltage Vclip is supplied to the gate of the clip transistor Mg, resulting in a state in which the voltage of the column signal line 5 can be clipped.

At time t1, φRES3, φRES4, and φRES5 become Low level so that the reset transistors Mc in the pixel rows 9-3, 9-4, and 9-5 are turned off. As a result, the input nodes NF become the floating state so that the reset voltages of the input nodes NF are read. At this time, the pixel rows 9-3, 9-4, and 9-5 are selected, and hence pixel signals from the three pixel rows are mixed on the column signal line 5, and the resultant voltage is written into the reset voltage capacitor CN1.

At time t7, the clip voltage Vclip becomes 0 V, which ends the effective period of the clipping. Moreover, φTX31, φTX41, and φTX51 become High level so that the transfer transistors Md1 in the row D1 of the pixel rows 9-3, 9-4, and 9-5 are turned on, with the result that the charges accumulated by irradiating light on the photodiodes D1 are transferred to the input nodes NF. Then, the voltages of the input node NF are reduced depending on the amounts of accumulated charges of the photodiodes D1.

At time t8, φTX31, φTX41, and φTX51 become Low level so that the transfer transistors Md1 in the row D1 of the pixel rows 9-3, 9-4, and 9-5 are turned off. This ends the transfer of the charges accumulated by irradiating light on the photodiodes D1 to the input nodes NF. Next, the luminance voltages of the input nodes NF are read. At this time, pixel signals from the pixel rows 9-3, 9-4, and 9-5, which are simultaneously selected, are mixed on the column signal line 5, and the resultant voltage is written into the luminance voltage capacitor CP1.

At time t10, φRES3, φRES4, and φRES5 become High level so that the reset transistors Mc in the pixel rows 9-3, 9-4, and 9-5 are turned on, which ends the floating state of the input node NF. At time t12, φSEL3, φSEL4, and φSEL5 become Low level so that the selection transistors Ma in the pixel rows 9-3, 9-4, and 9-5 are turned off, and the reading of the pixel signals in the pixel rows 9-3, 9-4, and 9-5 to the peripheral circuit 4 is completed.

At and after time t13, the reset voltages and the luminance voltages in the row D2 of the pixel rows are read. The reading operation for the row D2 is similar to the reading operation for the row D1 (times t0 to t12). At and after time t15, similarly to times t0 to t14, three pixel rows are simultaneously selected in sequence.

Figure 5:
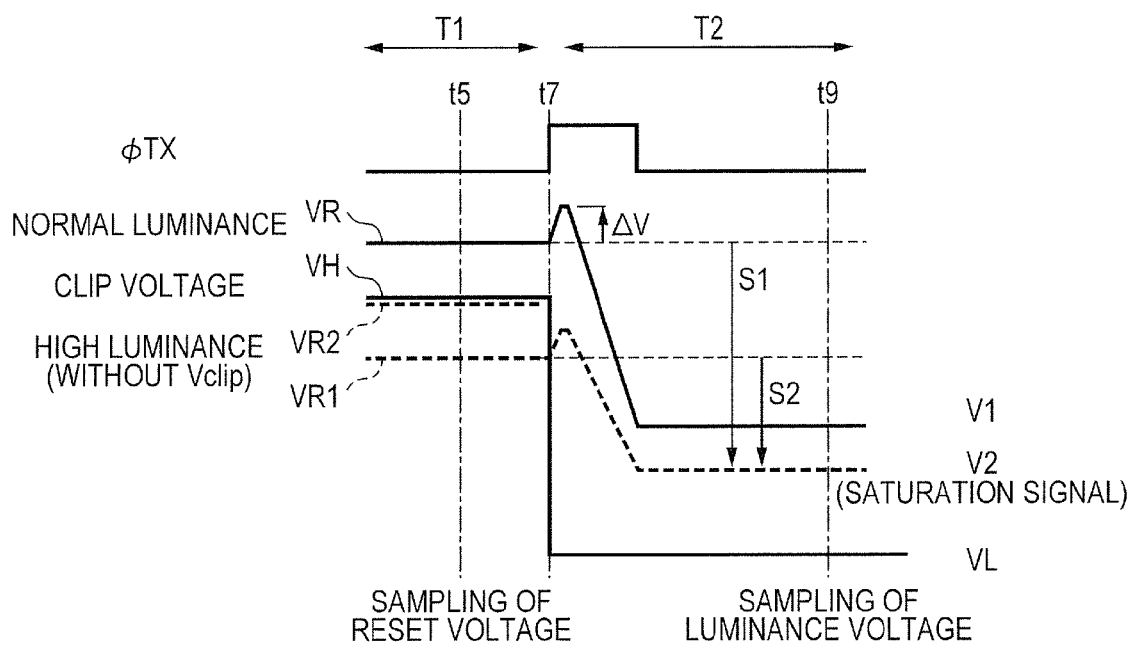
FIG. 5 is an explanatory diagram of a clip voltage of the first embodiment.

In FIG. 5, changes in voltages of the column signal line 5 at times of photographing a normal luminance subject and a high luminance subject are illustrated. In FIG. 5, a transfer pulse φTX, a voltage at the time of normal luminance, the clip voltage, and a voltage at the time of high luminance are illustrated in order from above. Period T1 represents a period from when the unit pixel 10 is reset to when φTX becomes High level (time t7), and Period T2 represents a period at and after the transfer of photocharges. Time t5 is a sampling time when a reset voltage VR is determined, and time t9 is a sampling time when a luminance voltage V1 or V2 is determined.

At the time of photographing the normal luminance subject, a pixel signal at the time when the input node NF is reset is output as the reset voltage VR to the column signal line 5. In Period T1, the clip voltage Vclip is a voltage VH, and because the reset voltage VR is higher than the voltage VH, the reset voltage VR is sampled without being clipped (time t5). At time t7, the transfer pulse φTX becomes High level, with the result that electric charges of the photodiodes are read to be output as the luminance voltage to the column signal line. An amplitude of the signal obtained when the transfer pulse φTX changes to High level and Low level is represented by ΔV. When φTX changes to High level, the electric charges of the photodiode D1 are transferred to the FD, and the voltage of the column signal line starts to be reduced based on the electric charges. At time t7, the clip voltage Vclip is reduced to a voltage VL (for example, 0 V) at which the luminance voltage is not clipped. At time t9, the luminance voltage V1 is sampled, and then, a differential signal (V1−VR) is obtained by the correlated double sampling.

Next, the blackening phenomenon at the time of photographing the high-luminance subject is described. In FIG. 5, pixel signals at the time of photographing the high-luminance subject are indicated by the broken line. In Period T1, when very strong light such as sunlight enters the photodiodes, a part of a large amount of photocharges generated in the photodiodes leaks into the FD to reduce the voltage of the FD. If the clipping circuit is not provided, a voltage VR1 obtained by superimposing the leak voltage on the reset voltage VR is disadvantageously output to the column signal line. In Period T2, when a saturation signal of a pixel, which is the luminance voltage, is represented by V2, at the time of photographing the normal-luminance subject, correlated double sampling with the reset voltage VR being a reference voltage is performed, and a differential signal S1 (=V2−VR) is obtained as a saturation signal level. However, at the time of photographing the high-luminance subject, correlated double sampling with a voltage VR1 being a reference voltage is performed, and a differential signal S2 (=V2−VR1) is obtained as a saturation signal level. In this manner, due to a variation in reset voltage as the reference voltage, the differential signal S2 disadvantageously becomes smaller than the differential signal S1. For example, in an image portion of the high-luminance subject such as spotlight, image signals of the spot portion have image signal levels that are lower than an image of a surrounding normal-luminance subject and appear black. This state is called the "blackening phenomenon".

In order to suppress the blackening phenomenon, the clipping circuit 14 limits the reduction in reset voltage of the column signal line in Period T1. In other words, in Period T1 when the high-luminance subject is photographed, the reset voltage of the column signal line is limited not to VR1 but to a clip voltage VH. Note that, the limited reset voltage is VR2, which is indicated by the broken line and is substantially the same voltage as the clip voltage VH.

As described above, the clipping circuit 14 is intended to limit the voltage of the column signal line in Period T1 so as not to be reduced too much, and hence the clip voltage needs to be sufficiently high. However, the voltage of the column signal line 5 may change depending on factors such as the column current source Ib connected to the column signal line 5, a voltage drop due to a resistance of the column signal line 5, and pixel signal mixing in which a plurality of pixels are simultaneously driven. If the clip voltage is set without taking the change in voltage into consideration, when the reset voltage is sampled, there may be a case where the gate voltage of the amplifier transistor Mb approaches the clip voltage VH. In this case, a current starts to flow through the clip transistor Mg, and the reset voltage starts to be clipped. The reset voltage VR obtained by the clipping is different for each column signal line, and appears as the vertical stripe noise. In other words, when the clip voltage is increased too much in order to suppress the blackening phenomenon, the vertical stripe noise is likely to occur in the dark.

According to this embodiment, an operating point of the column signal lines may be set sufficiently higher than the clip voltage while suppressing the blackening phenomenon and preventing the occurrence of the vertical stripe noise. Next, the setting of the clip voltage in this embodiment is described.

Figure 6A:
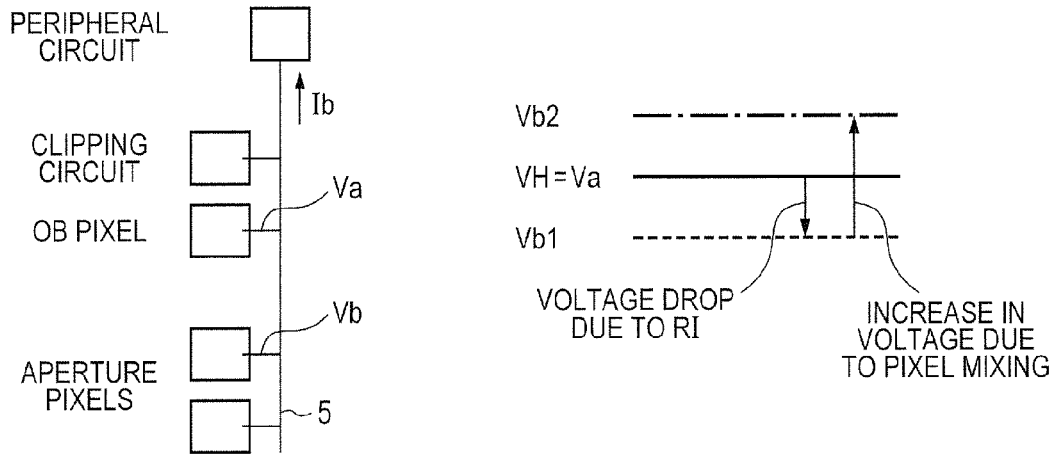
FIGS. 6A and 6B are explanatory diagrams of the clip voltage of the first embodiment.

In the left part of FIG. 6A, an arrangement of the unit pixels 10, the clipping circuit 14, and the peripheral circuit 4 in this embodiment is illustrated. A voltage of a unit pixel 10 close to the clipping circuit 14 is represented by Va, and a voltage of a unit pixel 10 far from the clipping circuit 14 is represented by Vb. Through the column signal line 5, a current flows from the unit pixels 10 toward the clipping circuit 14. The voltage is lowered by a resistance R of the column signal line 5, with the result that the voltage Va becomes lower than the voltage Vb. Assuming that an output voltage of the amplifier transistor Mb of the unit pixel 10 is constant irrespective of a distance from the clipping circuit 14, as a unit pixel 10 to be read becomes farther from the clipping circuit 14, the voltage of the column signal line 5 in the vicinity of the clipping circuit 14 becomes lower due to the resistance of the column signal line 5. Meanwhile, in the pixel signal mixing operation, a plurality of selection transistors Ma are simultaneously turned on so that a plurality of amplifier transistors Mb are connected to the column signal line 5 in parallel, and hence a substantial channel width of the amplifier transistors Mb is increased. This means that a gate-source voltage of the amplifier transistors Mb is reduced. The source voltage of the amplifier transistors Mb, that is, the operating point of the column signal line 5 is increased. Therefore, as compared to the OB pixel region 2 in which the n-pixel signal mixing is performed, the operating point of the voltage of the column signal line 5 in the aperture pixel region 3 in which the m-pixel signal mixing, which is larger than n rows, is performed, becomes higher. With the increased operating point of the voltage of the column signal line 5, it is difficult for the clip transistor Mg to be turned on even when the clip voltage is set high, with the result that the vertical stripe noise in the dark may be reduced. The clip voltage may be increased, and hence a range of the clip voltage may be increased, with the result that the blackening phenomenon at the time of high luminance may be effectively suppressed.

In the right part of FIG. 6A, the voltage of the column signal line 5 when the peripheral circuit 4, the clipping circuit 12, the OB pixel region 2, and the aperture pixel region 3 are arranged in the stated order in this embodiment is illustrated. In the column signal line 5, the voltage Vb of the unit pixel 10 that is far from the clipping circuit 14 is lowered from the voltage Va by a voltage drop RI due to the resistance of the column signal line to become a voltage Vb1 indicated by the broken line in the clipping circuit 14. The pixel signal mixing operation for n pixels is performed in the OB pixel region 2, and a pixel signal mixing operation for m pixels (m>n) is performed in the aperture pixel region 3. As a result, the voltage Vb1 is increased, and the voltage in the clipping circuit 14 is increased to a voltage Vb2 indicated by the one-dot chain line. Therefore, even in a case where the clip voltage VH is set to the voltage Va in the vicinity of the clipping circuit 14, it becomes difficult for a current to flow through the clip transistor Mg, and the vertical stripe noise is reduced.

Figure 6B:
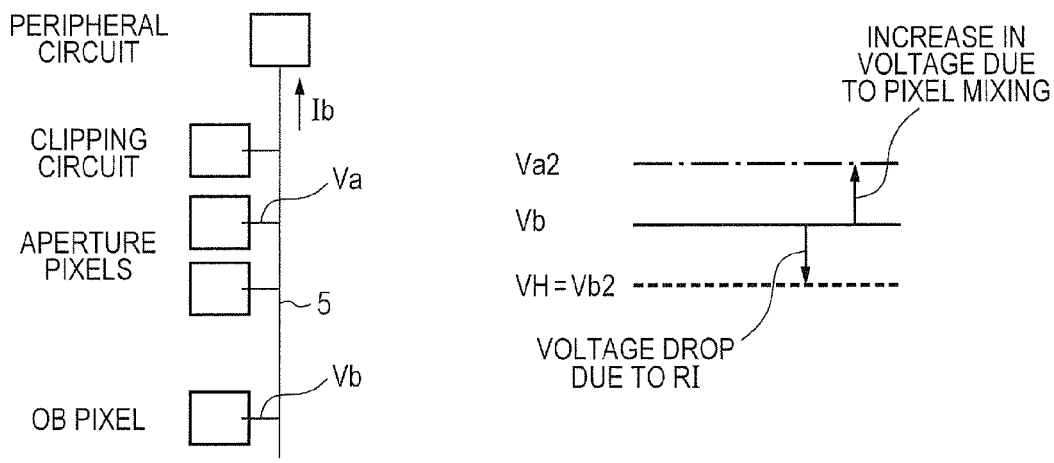

In FIG. 6B, a configuration in which the positions of the OB pixels and the aperture pixels in FIG. 6A are interchanged is illustrated. In the column signal line 5, the voltage Vb of the unit pixel 10 that is far from the clipping circuit 14 is lowered by the voltage drop RI due to the resistance R of the column signal line 5 to become the voltage Vb2 in the clipping circuit 14. The voltage Va of the unit pixel 10 in the vicinity of the clipping circuit 14 is increased by the pixel signal mixing to become the voltage Vat indicated by the one-dot chain line. In this case, the voltage Vb2 at the time when the OB pixel region 2 located relatively farther than the aperture pixel region 3 is read becomes the lowest. In other words, in reading the unit pixels in the OB pixel region 2, the clip transistor Mg is most likely to be turned on, and the vertical stripe noise is likely to occur. Here, in order not to clip the voltage of the column signal line 5, the clip voltage VH needs to be lowered to Vb2. However, when the clip voltage is lowered, a clip voltage range becomes narrower, and it becomes difficult to suppress the blackening phenomenon at the time of photographing the high-luminance image. Therefore, it can be identified from the above-mentioned discussion that, in order to suppress the vertical stripe noise in the dark while reducing the blackening phenomenon at the time of high luminance, the circuit arrangement in FIG. 6A according to this embodiment is more effective than the circuit arrangement in FIG. 6B.

Second Embodiment

Figure 7:
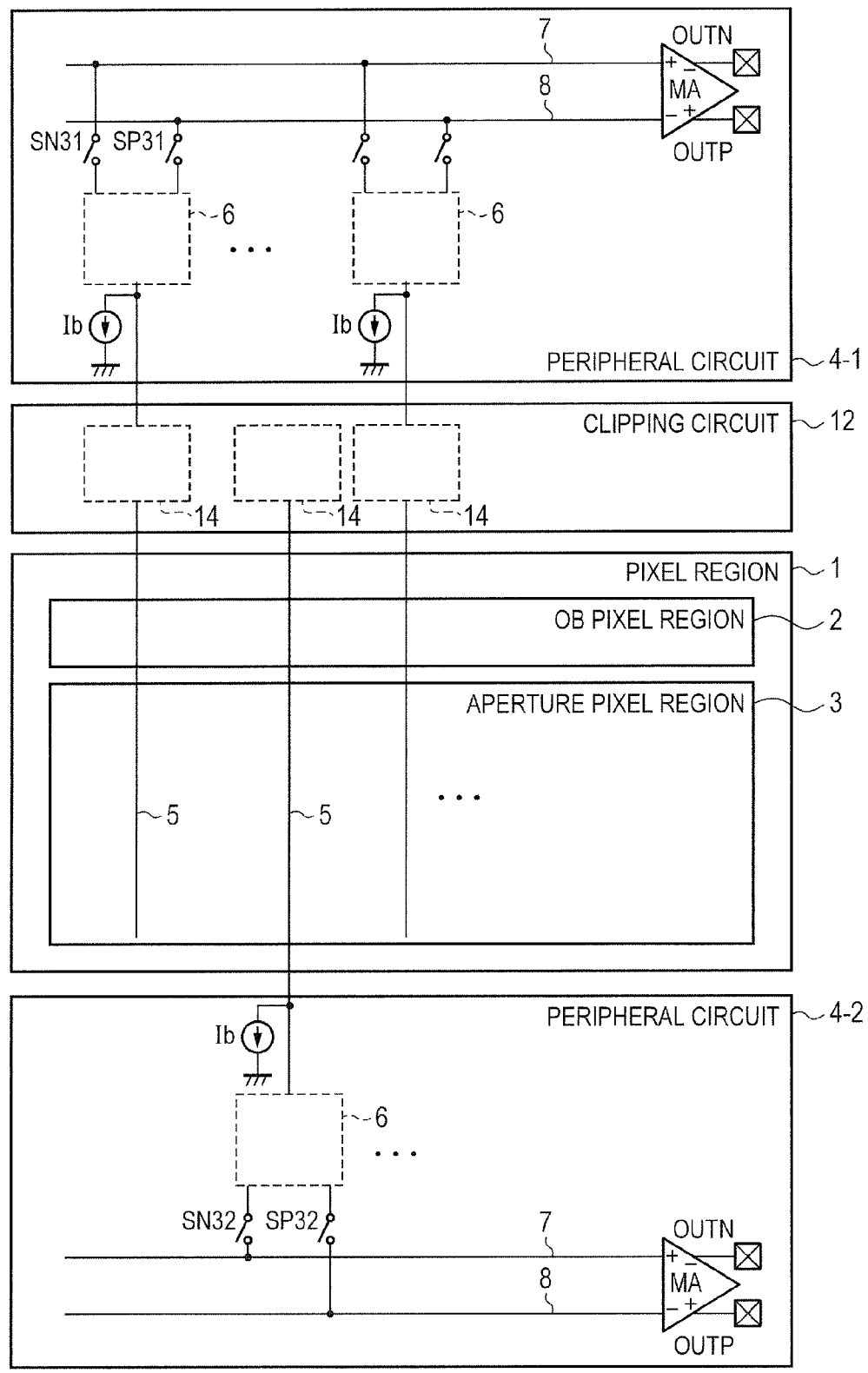
FIG. 7 is a circuit diagram of a solid-state image pickup apparatus according to a second embodiment of the present invention.

In FIG. 7, a circuit configuration of a solid-state image pickup apparatus according to a second embodiment of the present invention is illustrated. A difference from FIG. 1 resides in that peripheral circuits are arranged on both sides of the pixel region 1, one of which is a peripheral circuit 4-1 configured to read pixel signals in odd columns, and the other is a peripheral circuit 4-2 configured to read pixel signals in even columns. The reading operations of scanning the pixel rows in the OB pixel region 2 and scanning the pixel rows in the aperture pixel region 3 are similar to FIG. 3 and FIG. 4, respectively.

In an odd column (first column signal line), as described in the first embodiment, as a pixel row to be read is farther from the clipping circuit 12, the voltage of the column signal line 5 in the vicinity of the clipping circuit 14 becomes lower, and the vertical stripe noise is more likely to occur. On the other hand, in an even column (second column signal line), the current flows through the column signal line 5 in the opposite direction to that in the odd column. Therefore, when signals in a pixel row that is far from the clipping circuit 12 are read, the voltage of the column signal line 5 in the vicinity of the clipping circuit 12 becomes higher, and it becomes more difficult for the current to flow through the clip transistor. Consequently, in this embodiment, in reading a unit pixel in an odd column that is far from the clipping circuit 12, the voltage of the column signal line in the vicinity of the clipping circuit 12 may be the lowest. Meanwhile, simultaneous reading for n pixels is performed in the OB pixel region 2, and a pixel signal mixing operation for m pixels (m>n) is performed in the aperture pixel region 3. Therefore, the clipping circuit 12, the OB pixel region 2, and the aperture pixel region 3 may be arranged in the stated order as in FIG. 7 to increase the voltage of the column signal line 5 in the vicinity of the clipping circuit 12. Therefore, at the time of reading the reset voltage, it becomes difficult for the clip transistor to be turned on, and the vertical stripe noise may be effectively suppressed.

In this embodiment, the aperture pixel region in which the signal mixing for m rows is performed is arranged as a region including the unit pixel in the odd column that is located far from the clipping circuit 12 and is likely to generate the vertical stripe noise, with the result that the clip voltage range may be increased without generating the vertical stripe noise. In this manner, the blackening phenomenon may be effectively suppressed, and at the same time, the vertical stripe noise may be reduced.

Third Embodiment

Figure 8:
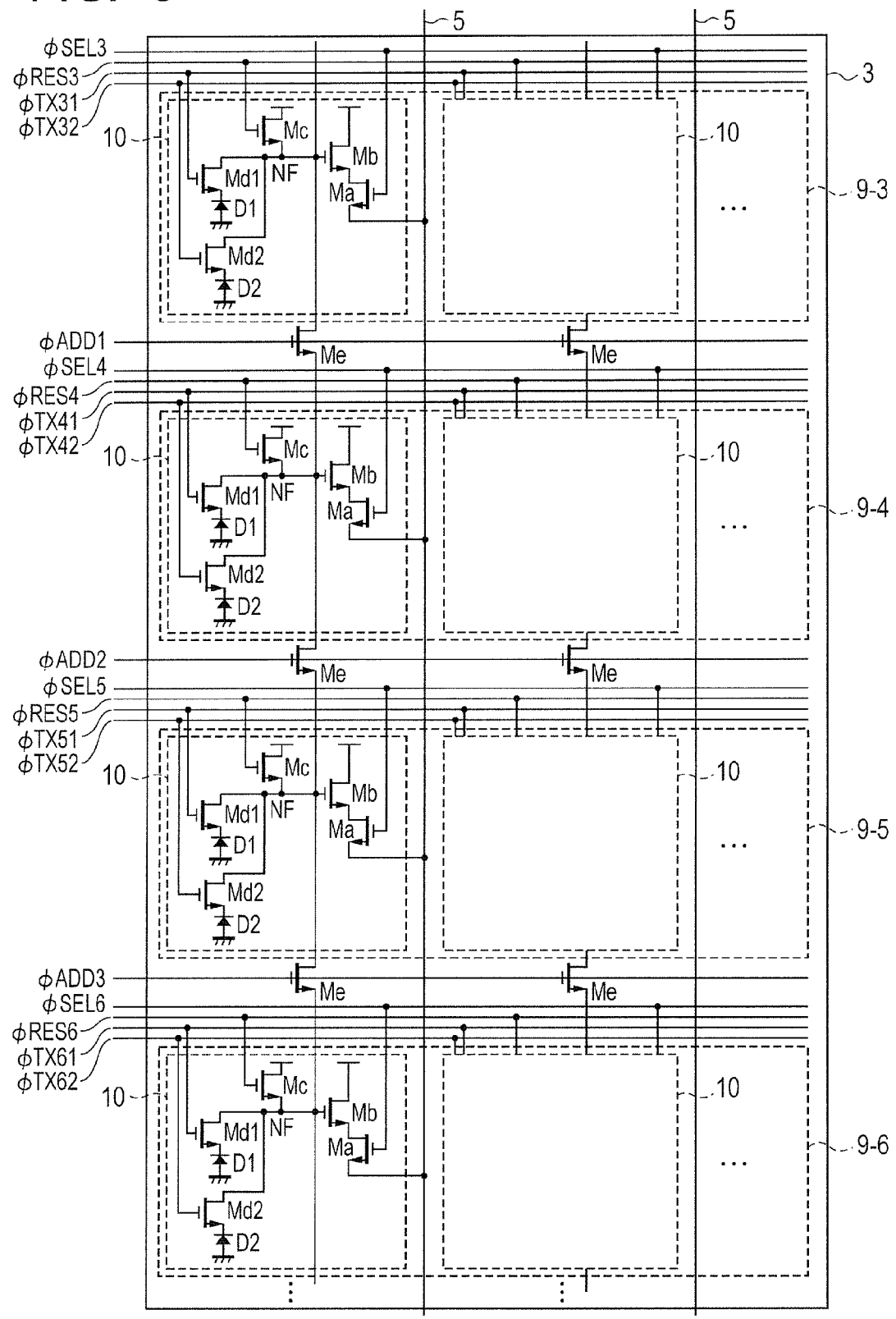
FIG. 8 is a circuit diagram of an aperture pixel region of a third embodiment of the present invention.

In FIG. 8, circuits in an aperture pixel region 3 of a solid-state image pickup apparatus according to a third embodiment of the present invention are illustrated. A difference from the first embodiment resides in that FD-connection transistors Me for making FD regions conductive or non-conductive are arranged between input nodes NF of a plurality of unit pixels 10. Moreover, the FD-connection transistors Me are also arranged in the OB pixel region 2. To a gate of the FD-connection transistor, control signals φADD1 to φADD3 are input, and when φADD1 to φADD3 become High level, the input nodes NF of unit pixels 10 in adjacent rows are connected to each other. A reading operation for the OB pixel region 2 in this embodiment is similar to the operation illustrated in the timing chart (FIG. 3) at the time of scanning the OB pixel region in the first embodiment. In other words, the FD-connection transistors Me are also arranged in the OB pixel region 2, but when signals in the OB pixel region 2 are read, the FD-connection transistors Me that are present in the OB pixel region 2 are turned off.

Figure 9:
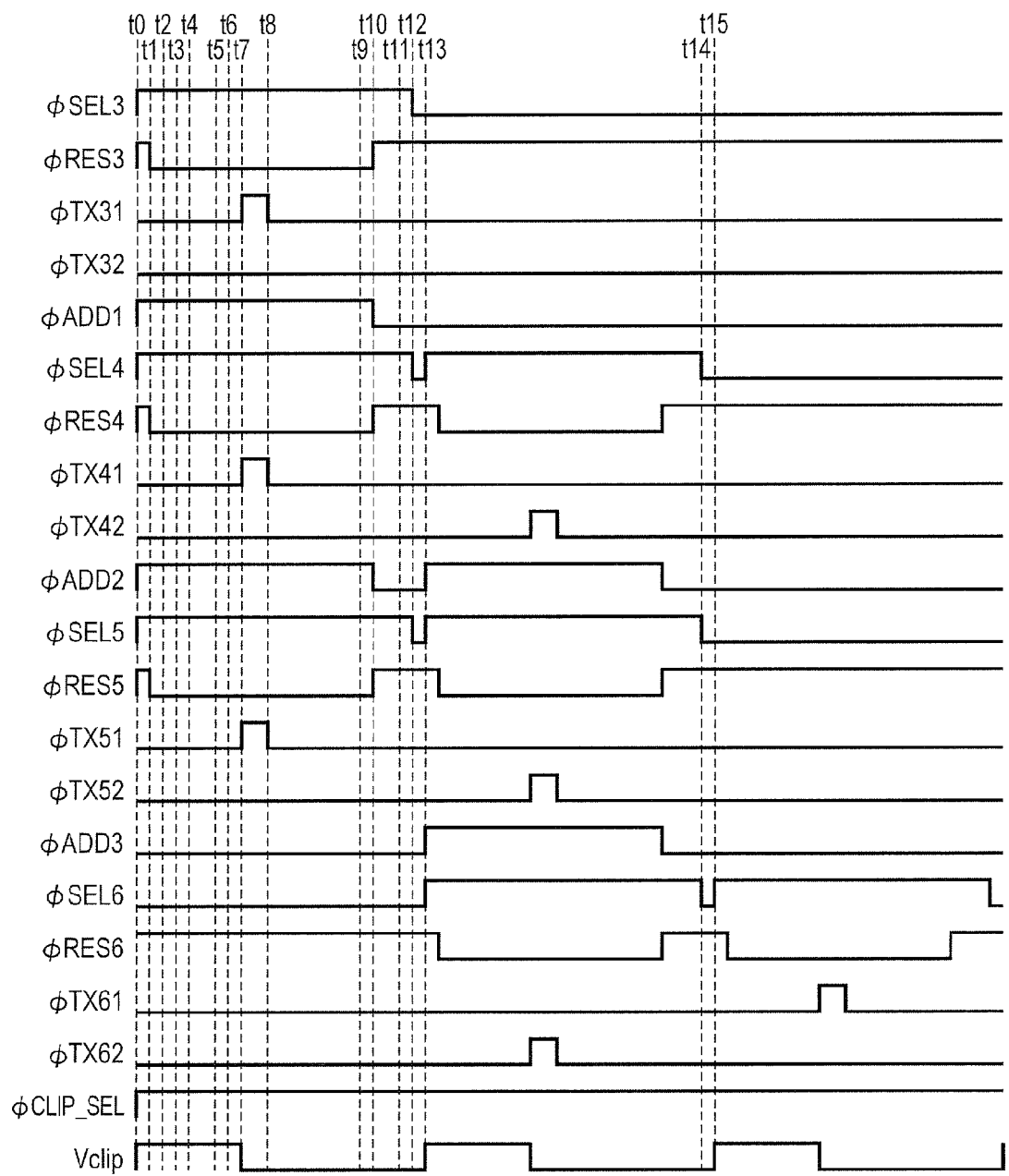
FIG. 9 is a timing chart for illustrating an operation at a time of scanning the aperture pixel region of the third embodiment.

FIG. 9 is a timing chart at the time of scanning the aperture pixel region 3 in this embodiment. A difference from FIG. 4 resides in that the control signals φADD1, φADD2, and φADD3 for the FD-connection transistor Me are added. Operations of the control signals other than φADD1, φADD2, and φADD3 are similar to the operations illustrated in FIG. 4. At time t0, φADD1 and φADD2 become High level so that the FD-connection transistors Me are turned on, with the result that the input nodes NF in the pixel rows 9-3, 9-4, and 9-5 are connected. At time t7, the transfer transistor Md1 or Md2 is turned on, and the electric charges from the photodiodes D1 or D2 that are present in the three unit pixels 10 are added and mixed on the connected input nodes NF.

When the FD-connection transistors Me are provided, as compared to the case where the FD-connection transistors Me are not provided, even in a case where there is a difference between intensities of signals from the unit pixels to be mixed, the signals may be mixed more accurately. Moreover, also in this embodiment, as in the first embodiment, the clipping circuit 12 is arranged at a position that is closer to the OB pixel region in which n rows (m>n) are mixed than to the aperture pixel region in which m rows are mixed, with the result that the vertical stripe noise may be reduced while suppressing the blackening phenomenon.

Fourth Embodiment

Figure 10A:
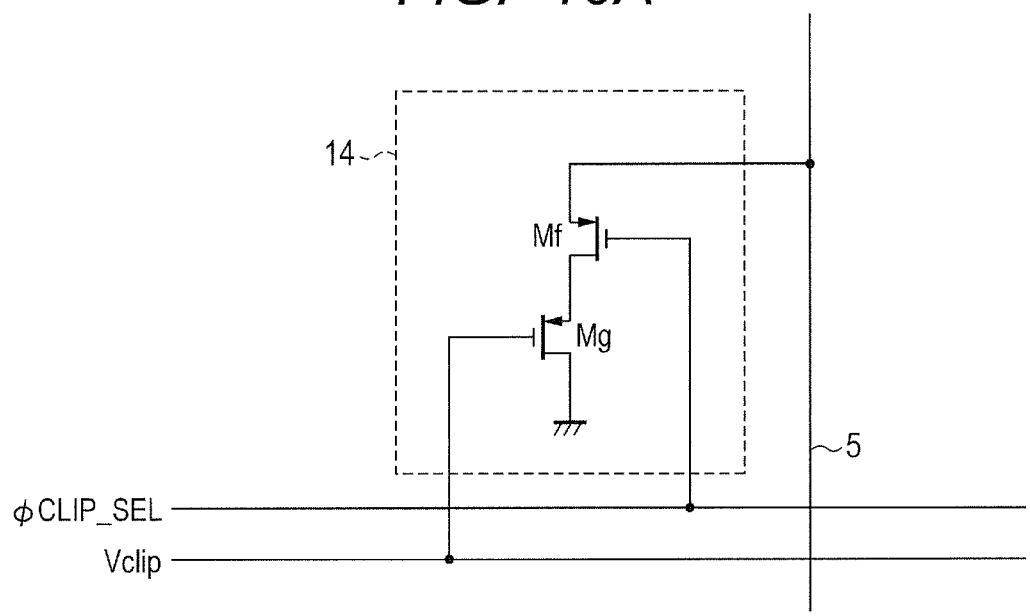
FIG. 10A is a circuit diagram of a clipping circuit of a fourth embodiment of the present invention.
Figure 10B:
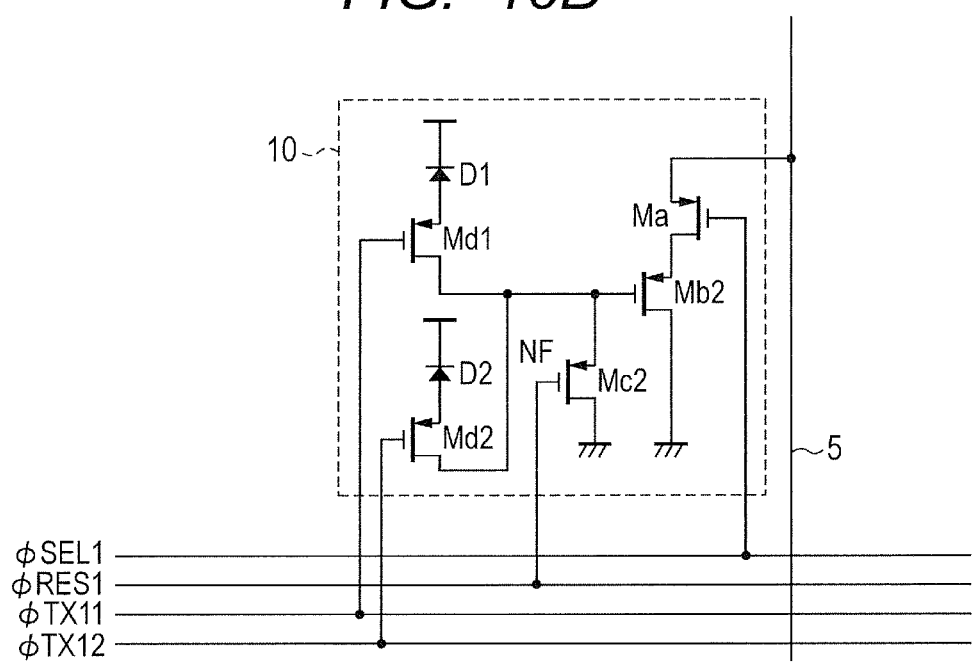
FIG. 10B is a circuit diagram of a unit pixel of the fourth embodiment.

In FIG. 10A, a clipping circuit 14 according to a fourth embodiment of the present invention is illustrated, and in FIG. 10B, a unit pixel 10 of the fourth embodiment is illustrated. A difference from the first embodiment resides in that, as the selection transistor Ma, the amplifier transistor Mb, the reset transistor Mc, the transfer transistors Md1 and Md2, the clip selection transistor Mf, and the clip transistor Mg, the n-type MOS transistors are replaced by p-type MOS transistors. In this embodiment, the column current source Ib is connected to the power source. In other words, a current from the column current source Ib flows to the source of the amplifier transistor Mb via the column signal line 5.

Reading operations for the OB pixel region 2 and the aperture pixel region 3 in this embodiment are equivalent to those obtained by interchanging High level and Low level of the pulses in the timing charts of FIG. 3 and FIG. 4, respectively. The clip voltage applied to the gate of the clip transistor Mg is set to a predetermined Vclip voltage at a time of sampling the reset voltage, and to a power supply voltage at a time of sampling the luminance voltage.

In this embodiment, the column current source Ib is connected to the power source, and hence the current from the column signal line 5 flows from the clipping circuit 12 to the pixel region 1. Due to the voltage drop, the voltage of the column signal line 5 becomes higher as the column signal line 5 approaches the clipping circuit 12. Therefore, assuming that the output voltage of the amplifier transistor Mb of the unit pixel 10 is constant irrespective of a distance from the clipping circuit 12, as a unit pixel 10 to be read becomes farther from the clipping circuit 12, the voltage at the operating point of the column signal line 5 in the vicinity of the clipping circuit 12 becomes higher. As the voltage at the operating point of the column signal line 5 in the vicinity of the clipping circuit 12 becomes higher, an absolute value of a gate-source voltage of the clip transistor Mg becomes larger. As a pixel row from which signals are to be read becomes farther from the clipping circuit 12, it becomes easier for a current to flow through the clip transistor Mg. In view of the above, a lower limit of the clip voltage range in which the vertical stripe noise does not occur is determined by the pixel row that is far from the clipping circuit 12. In this embodiment, the signal mixing is performed at the time of scanning the aperture pixel region 3. Therefore, as compared to the OB pixel region 2 in which the signal mixing is not performed, the operating point of the voltage of the column signal line in reading the pixel signals becomes lower, with the result that the occurrence of the vertical stripe noise is suppressed. In this embodiment, the aperture pixel region in which the signal mixing operation is performed is arranged as the region that is located far from the clipping circuit 12 and includes pixel rows in which the vertical stripe noise is likely to occur. In this manner, the clip voltage range may be increased so that the blackening phenomenon does not occur while suppressing the vertical stripe noise.

In this embodiment, the p-type MOS transistors are used in the pixel region 1. In general, the p-type MOS transistor generates less 1/f noise than the n-type MOS transistor, and hence in this embodiment, an effect of reduced noise as compared to the first embodiment in which the n-type MOS transistors are used may be obtained.

(Embodiment of Image Pickup System)

An image pickup system according to a fifth embodiment of the present invention is described with reference to FIG. 11. Components similar to those of the solid-state image pickup apparatus according to the first to fourth embodiments illustrated in FIG. 1 to FIG. 10B are denoted by the same reference symbols, and a description thereof is omitted or briefly given.

Figure 11:
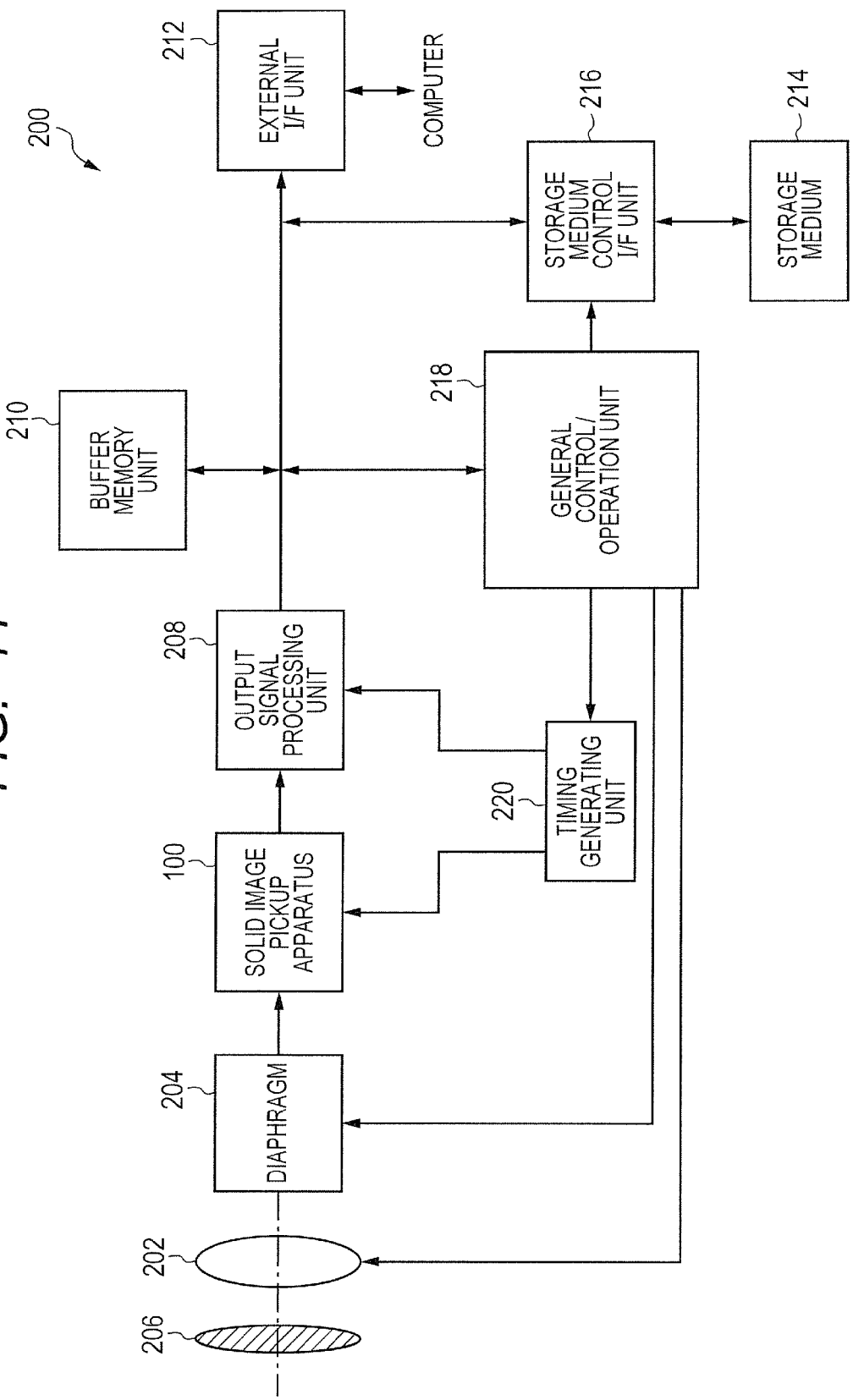
FIG. 11 is a block diagram of an image pickup system according to a fifth embodiment of the present invention.

FIG. 11 is a block diagram for illustrating a configuration of the image pickup system according to this embodiment. The solid-state image pickup apparatus described in the above-mentioned first to fourth embodiments are applicable to various kinds of image pickup systems. Examples of the image pickup system include a digital still camera, a digital camcorder, and a monitoring camera. An image pickup system 200 exemplified in FIG. 11 includes a solid-state image pickup apparatus 100, a lens 202 configured to form an optical image of a subject on the solid-state image pickup apparatus 100, a diaphragm 204 configured to vary an amount of light that passes through the lens 202, and a barrier 206 configured to protect the lens 202. The lens 202 and the diaphragm 204 form an optical system configured to collect the light into the solid-state image pickup apparatus 100. The image pickup system 200 includes an output signal processing unit 208 configured to process output signals, which are output by the solid-state image pickup apparatus 100. The output signal processing unit 208 performs AD conversion for converting analog signals output by the solid-state image pickup apparatus 100 into digital signals. In addition, the output signal processing unit 208 performs an operation of performing various corrections and compressions as necessary to output image data.

The image pickup system 200 includes a buffer memory unit 210 configured to store the image data temporarily, and an external interface unit (external I/F unit) 212 configured to communicate to/from an external computer and the like. The image pickup system 200 includes a storage medium 214 such as a semiconductor memory configured to record or read imaging data, and a storage medium control interface unit (storage medium control I/F unit) 216 configured to record or read the imaging data to or from the storage medium 214. Note that, the storage medium 214 may be built in the image pickup system 200, or may be removably mounted thereon.

The image pickup system 200 includes a general control/operation unit 218 configured to perform various kinds of operations and control for the overall digital still camera, and a timing generating unit 220 configured to output various kinds of timing signals to the solid-state image pickup apparatus 100 and the output signal processing unit 208. In this case, the timing signals may be input from the outside, and the image pickup system 200 only needs to include at least the solid-state image pickup apparatus 100 and the output signal processing unit 208 configured to process the output signal output from the solid-state image pickup apparatus 100.

The solid-state image pickup apparatus 100 that performs imaging surface phase difference AF outputs a focus detection signal, which is based on a signal output by a focus detection pixel, and imaging signals to the output signal processing unit 208. The output signal processing unit 208 uses the focus detection signal to detect whether or not the subject is in focus. The output signal processing unit 208 also uses the imaging signals to generate an image. In a case where the output signal processing unit 208 detects that the subject is out of focus, the general control/operation unit 218 drives the optical system in a direction of bringing the subject into focus. The output signal processing unit 208 uses the focus detection signal output from the solid-state image pickup apparatus 100 again to detect whether or not the subject is in focus. Thereafter, the solid-state image pickup apparatus 100, the output signal processing unit 208, and the general control/operation unit 218 repeat this operation until the subject is brought into focus.

As described above, the image pickup system according to this embodiment, to which the solid-state image pickup apparatus 100 is applied, may perform an image pickup operation. The image pickup system may be configured by using the solid-state image pickup apparatus 100 according to the first or second embodiment to realize a high-performance image pickup system having a high S/N ratio.

The above-mentioned embodiments merely exemplify some aspects to which the present invention may be applied, and in no way hinder any modifications and alternations from being made as appropriate without departing from the spirit of the present invention, and the configurations in the first to fourth embodiments may be combined. For example, the FD-connection transistor according to the third embodiment may be arranged in the pixel region according to the first embodiment or the second embodiment. Further, in the solid-state image pickup apparatus according to the first to third embodiments, the configuration of the fourth embodiment, which uses the p-type MOS transistors, may be employed.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-174954, filed Aug. 29, 2014, which is hereby incorporated by reference herein in its entirety.

What is claimed is:

1. A solid-state image pickup apparatus, comprising:
a pixel region, in which a plurality of pixels each including an amplifier transistor are arranged two-dimensionally in a plurality of rows and a plurality of columns, and which includes an n-row signal mixing region in which outputs of n amplifier transistors are mixed, where n is a natural number of 1 or more, and an m-row signal mixing region in which outputs of m amplifier transistors are mixed, where m>n;
a column signal line to which a voltage from the amplifier transistor is output; and
a clipping circuit, which is configured to clip a voltage in the column signal line, and is arranged at a position that is closer to the n-row signal mixing region than to the m-row signal mixing region.

2. A solid-state image pickup apparatus according to claim 1, further comprising a column current source, which serves as a load for the amplifier transistor,
wherein along the column signal line, the column current source, the clipping circuit, the n-row signal mixing region, and the m-row signal mixing region are arranged in the stated order.

3. A solid-state image pickup apparatus according to claim 1, wherein the n-row signal mixing region is set in an optical black pixel region in which a plurality of optical black pixels, which are a part of the plurality of pixels, are arranged in a plurality of rows, and the m-row signal mixing region is set in an aperture pixel region in which a plurality of aperture pixels, which are another part of the plurality of pixels, are arranged in a plurality of rows.

4. A solid-state image pickup apparatus according to claim 2, wherein the amplifier transistor comprises an n-type MOS transistor, and includes a source from which a current flows to the column current source via the column signal line.

5. A solid-state image pickup apparatus according to claim 2,
wherein the amplifier transistor comprises a p-type MOS transistor, and
wherein a current from the column current source flows to a source of the amplifier transistor via the column signal line.

6. A solid-state image pickup apparatus according to claim 2,
wherein the column signal line comprises a first column signal line and a second column signal line,
wherein along the first column signal line, the column current source, the clipping circuit, the n-row signal mixing region, and the m-row signal mixing region are arranged in the stated order, and
wherein along the second column signal line, the clipping circuit, the n-row signal mixing region, the m-row signal mixing region, and the column current source are arranged in the stated order.

7. A solid-state image pickup apparatus according to claim 1,
wherein each of the plurality of pixels includes a floating diffusion configured to store electric charges obtained by photoelectric conversion, and
wherein the clipping circuit is configured to clip the voltage of the column signal line based on a voltage of the floating diffusion that is reset.

8. A solid-state image pickup apparatus according to claim 7, further comprising a connection transistor configured to mix electric charges of a plurality of the floating diffusions.

9. An image pickup system, comprising:
a solid-state image pickup apparatus having,
a pixel region, in which a plurality of pixels each including an amplifier transistor are arranged two-dimensionally in a plurality of rows and a plurality of columns, and which includes an n-row signal mixing region in which outputs of n amplifier transistors are mixed, where n is a natural number of 1 or more, and an m-row signal mixing region in which outputs of m amplifier transistors are mixed, where m>n,
a column signal line to which a voltage from the amplifier transistor is output, and
a clipping circuit, which is configured to clip a voltage in the column signal line, and is arranged at a position that is closer to the n-row signal mixing region than to the m-row signal mixing region; and
a signal processing unit configured to process signals output from the solid-state image pickup apparatus.

* * * * *